United States Patent [19]
Mehdizadeh et al.

[11] Patent Number: 4,841,248
[45] Date of Patent: Jun. 20, 1989

[54] TRANSVERSE FIELD LIMITED LOCALIZED COIL FOR MAGNETIC RESONANCE IMAGING

[75] Inventors: Mehrdad Mehdizadeh, University Hts.; John L. Patrick, Solon; George J. Misic, Novelty, all of Ohio

[73] Assignee: Picker International, Inc., Highland Hts., Ohio

[21] Appl. No.: 86,277

[22] Filed: Aug. 17, 1987

Related U.S. Application Data

[63] Continuation-in-part of Ser. No. 931,726, Nov. 17, 1986, Pat. No. 4,753,738, which is a continuation-in-part of Ser. No. 765,708, Aug. 14, 1985, Pat. No. 4,793,356.

[51] Int. Cl.$^4$ .......................................... G01R 33/20
[52] U.S. Cl. ..................................... 324/318; 128/653
[58] Field of Search ............... 324/307, 309, 318, 322; 333/219, 235; 128/653

[56] References Cited

U.S. PATENT DOCUMENTS

| | | | |
|---|---|---|---|
| 4,321,537 | 5/1982 | Yokokawa et al. | 324/312 |
| 4,439,733 | 3/1984 | Hinshaw et al. | 324/322 |
| 4,545,384 | 10/1985 | Kawachi | 128/653 |
| 4,567,893 | 2/1986 | Charles et al. | 128/653 |
| 4,581,582 | 4/1986 | Redington | 324/309 |
| 4,591,789 | 5/1986 | Glover et al. | 324/307 |
| 4,614,195 | 9/1986 | Bottomley et al. | 128/653 |
| 4,616,183 | 10/1986 | Glover et al. | 324/309 |
| 4,618,827 | 10/1986 | Redington et al. | 324/309 |
| 4,680,550 | 7/1987 | Krause | 324/318 |
| 4,701,706 | 10/1987 | Haacke | 324/309 |
| 4,736,161 | 4/1988 | Prevot et al. | 324/318 |
| 4,739,269 | 4/1988 | Kopp | 324/318 |

FOREIGN PATENT DOCUMENTS

| | | |
|---|---|---|
| 0122593 | 10/1984 | European Pat. Off. . |
| 0167350 | 8/1986 | European Pat. Off. . |
| 2151791 | 7/1985 | United Kingdom . |

OTHER PUBLICATIONS

"Suppression of Respiratory Motion Artifacts in Magnetic Resonance Imaging" by Wood, et al., Med. Phys. 13(6), Nov./Dec. 1986, pp. 794-805.
"Artifact Suppression Technique (MAST) for MR Imaging" by Pattany, et al., J. Comput. Assist. Tomogr., vol. 11, No. 3, 1987, pp. 369-377.
"Ring Resonator RF-Probes for Proton Imaging Above 1 Telsa" by P. Roschmann, Philips GmbH Forschungslaboratorium Hamburg, D2, Hamburg 54, FRG, pp. 634-635.
"Quadrature Detection Coils-A Further 2 Improvement in Sensitivity" by Chen, et al., J. Mag. Res. 54, (1983), pp. 324-327.
"An Efficient DeCoupler Coil Design which Reduces Heating in Conductive Samples in Superconducting Spectrometers" by Alderman, et al., J. Mag. Res. 36, (1979), pp. 447-451.
"Slotted Tube Resonator: a New NMR Probe Head at High Observing Frequencies" by Schneider, et al., Rev. Sci. Inst., vol. 48, No. 1, Jan. 1977, pp. 68-73.
"Crossed Slotted Tube Resonator (CSTR)—a New Double Resonance NMR Probehead" by Schneider, et al., Rev. Sci. Inst., vol. 48, No. 7, Jul. 1977, pp. 832-834.
"The Slotted Cylinder, an Efficient Probe for NMR Imaging" by Leroy-Willig, et al., Inst. d'Elec. Fondamentale-Batiment 220, Universite Paris-Sud.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

Magnets (12) create a main magnetic field along a z-axis through an image region. A localized coil (D) is disposed in the image region at least to receive magnetic resonance signals from nuclei of the subject which have been induced to resonance. The localized coil includes an inner conductor (30), preferably a plate, which defines a current path extending along the z-axis. The inner conductor is mounted closely adjacent and parallel to a surface of the subject. An outer conductor (32), preferably also a plate, is mounted parallel to but further from the subject than the first conductor. A connecting member (34) interconnects a first end of the inner and outer conductors and is disposed perpendicular to the z-axis. A matching circuit (36) including capacitors (50) which define the resonant frequency of the coil are connected adjacent second ends of the inner and outer conductors. Because the nuclei induced to resonance within the z-axis magnetic field generate magnetic resonance components in the x-y plane, an optimal coupling is achieved to reception of the magnetic resonance signals.

20 Claims, 3 Drawing Sheets

TRANSVERSE FIELD LIMITED LOCALIZED COIL FOR MAGNETIC RESONANCE IMAGING

The present invention is a continuation-in-part of prior pending application ser. No. 931,726, filed Nov. 17, 1986, now U.S. Pat. No. 4,752,738 which in turn is a continuation-in-part of application ser. No. 765,708, filed Aug. 14, 1985, now U.S. Pat. No. 4,793,356.

BACKGROUND OF THE INVENTION

The present invention relates to the magnetic resonance arts. It finds particular application in conjunction with localized coils for medical imaging equipment to receive electromagnetic signals from resonating nuclei and will be described with particular reference thereto. It is to be appreciated, however, that the invention may also find utility in other magnetic resonance applications, such as exciting resonance, chemical analysis, well logging, and the like.

Heretofore, various types of coils have been positioned to receive electromagnetic signals for magnetic resonance imaging and spectroscopy, including whole body, body portion, and localized coils. The whole body and body portion receiving coils had standard sizes which were selected for readily receiving the patient's whole body or a selected body portion. Due to the standardized coil size and variable patient size, a significant void or empty region was commonly defined between the coil and the portion of the patient to be imaged.

Localized or surface coils were configured from rigid and flexible non-conductive sheets of plastic or nylon on which wire loops were mounted. Rigid flat coils were constructed in a variety of sizes to facilitate positioning adjacent the selected area of the patient to be imaged. When a flat coil was positioned adjacent a relatively flat area of the patient, the intervening air gap was relatively small as the air gap associated signal-to-noise degradation and aliasing. Flexible coils could be bent or wrapped around curved portions of the patient for a better, substantially air gap-free fit.

The wire or other conductors on the localized coils were commonly wound in circular loops on the surface of the plastic sheet. In use, the loops were positioned parallel to the surface of the patient. With a patient positioned along a z-axis magnetic field, coil loops disposed adjacent the patient's back were positioned in an x-z plane. An image plane transversely through the patient, e.g. an x-y plane, would normally intersect the surface coil at two points. Radio frequency magnetic resonance signals originating within this plane induced a like radio frequency current signal within coil segments at the intersection of the x-y plane, particularly segments that extend perpendicular to the x-y plane. However, because the coil was connected in a loop, the currents induced at opposite points were in the opposite direction around the loop and, hence, tended to cancel.

To receive signals from deeper within the patient, larger diameter loops were utilized. The depth of the coil's region of sensitivity has been adjusted by selecting more complex winding patterns, such as a planar arrangement of concentric loops through which current flows in different directions. However, the complex loop arrangements still had the high magnetic energy losses of the single loop.

At high frequencies, coils placed against the subject interacted strongly with the subject. The coils were most sensitive to the regions of the subject which were in immediate proximity to the coil segments. Increasing the complexity of the coil winding placed additional coil segments adjacent the subject, each of which was more sensitive to the immediately contiguous region. The more windings in the coil pattern, the more the signals from regions adjacent the subject surface dominated the signals from more remote regions. Other problems attributable to high sensitivity near the conductors were also aggravated.

A localized coil is provided which overcomes the above referenced problems and others by interacting with the subject in an optimal manner. In a transmit mode, it produces a more homogeneous field pattern within the subject and a receive mode provides an improved signal-to-noise ratio.

SUMMARY OF THE INVENTION

In accordance with the present invention, a localized coil is provided. A subject is disposed within a main magnetic field which is directed along a main magnetic field axis. The localized coil includes an inner conductor extending parallel to the magnetic field axis and an outer conductor extending parallel to the magnetic field axis but further displaced from the subject than the inner conductor. The inner and outer conductors are electrically connected adjacent a first end by an electrical connecting member.

In accordance with a more limited aspect of the present invention at least the outer conductor is a wide sheet or plate of electrically conductive material.

In accordance with another more limited aspect of the present invention, a capacitive coupling is provided between the other end of the conductor.

In accordance with another more limited aspect of the present invention, the two conductors are parallel plates. The outer plate is larger than the inner plate.

In accordance with yet another more limited aspect of the present invention, the first conductor is surrounded along at least one portion of its length by an electrically conductive shield. The electrically conductive shield is electrically connected to the outer conductor.

A first advantage of the present invention resides in its improved signal-to-noise ratio.

A further advantage of the present invention is that it optimizes patient loading.

Another advantage of the present invention resides in a higher intrinsic Q of the coil which leads to less conductor loss.

Yet another advantage of the present invention is an increase in the field uniformity. Particularly, dark areas in sagittal views, known as phase reversal areas, are eliminated.

Still further advantages of the present invention will become apparent to those of ordinary skill in the art upon reading and understanding the detailed description of the preferred embodiments.

BRIEF DESCRIPTION OF THE DRAWINGS

The invention may take form in various parts and arrangements of parts or in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
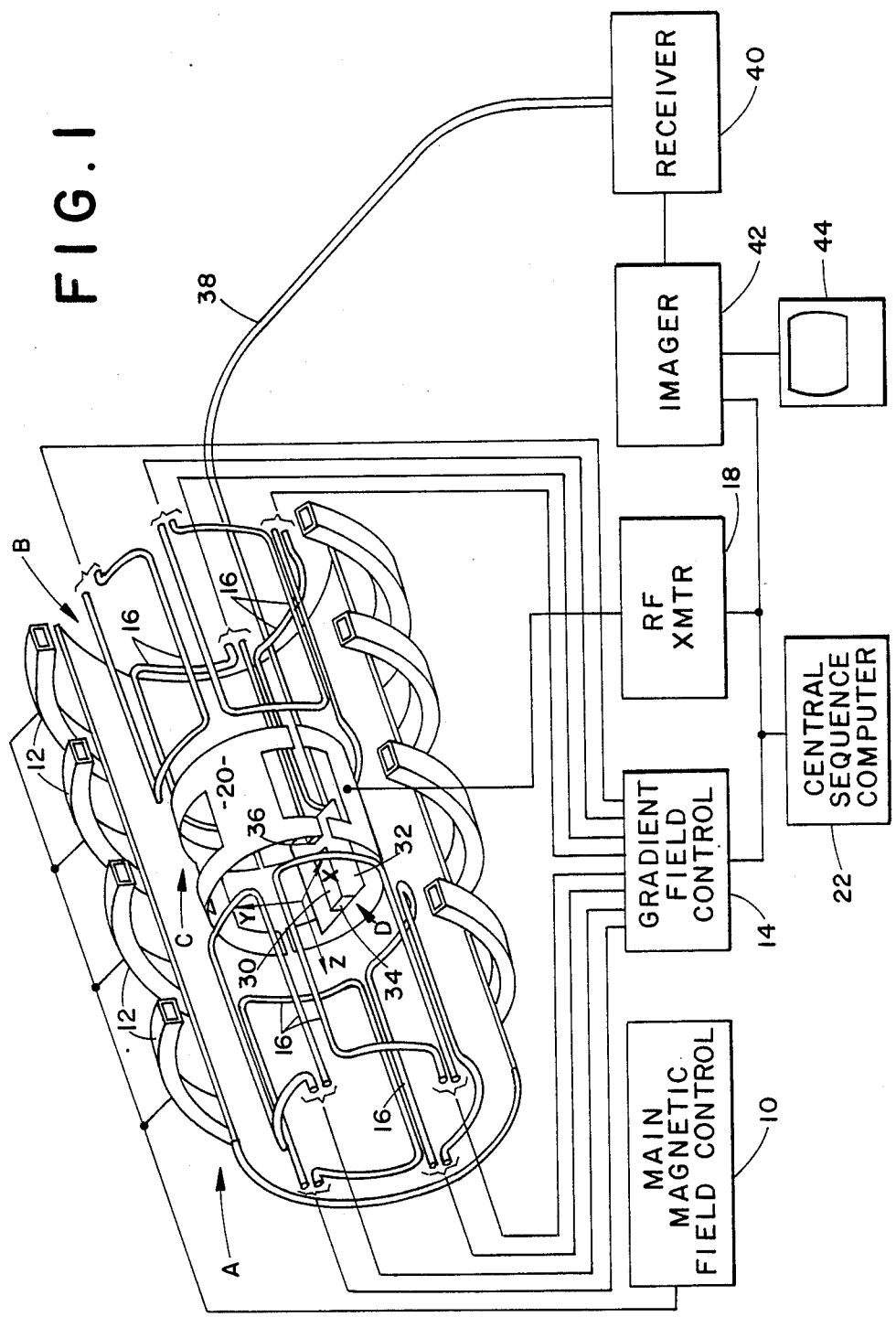
FIG. 1 is a diagrammatic illustration of a magnetic resonance imaging apparatus incorporating the present invention.

With reference to FIG. 1, a magnetic resonance imaging apparatus includes a main magnetic field generating means A for establishing a generally uniform, main magnetic field extending longitudinally through an imaging region along a z-axis. A gradient field means B selectively produces magnetic field gradients transversely across the main magnetic field of the image region. A magnetic resonance excitation means C excites magnetic resonance in selected nuclei of a patient or subject disposed in the image region. The resonating nuclei generate radio frequency magnetic resonance signals which are received by a surface or localized coil D. More specifically, the surface coil is disposed adjacent a preselected region of the subject to be imaged such that it receives magnetic resonance signals from nuclei disposed in the preselected region of interest. Electronic processing circuitry E converts the received radio frequency signals into an image representation indicative of nuclei density, relaxation time, position, nuclei characteristics, or the like.

The main magnetic field means A includes a magnetic field control circuit 10 and a plurality of high power magnets 12. A gradient magnetic field control circuit or means 14 applies current pulsed to gradient coils 16 to create gradients across the main magnetic field. The current pulse to each gradient coil is controlled by the gradient field means B to select the angular orientation of the transverse gradient fields generated by a gradient field coil 16. The resonance excitation means C includes a radio frequency transmitter 18 and a radio frequency coil 20 to broadcast radio frequency (RF) signals that excite and manipulate magnetic resonance. Optionally, the localized coil D may be connected with the RF transmitter to apply the RF pulses to adjacent regions of the subject. A central computer 22 coordinates the sequence and timing of the gradient field pulses and the RF pulses.

The signals emitted by the relaxation of nuclei in the subject have components only in a plane that is normal to the direction of the static magnetic field, i.e. in the x-y plane which is normal to the z-axis. Accordingly, only those conductors of the localized coil which intersect the x-y plane are capable of detecting the magnetic resonance signal. RF signals from the x-y plane will try to induce a like RF current signal along the z-axis in the intersecting coil segment.

In high frequency magnetic resonance, the conductors contribute to a heavy interaction with the subject which results in Q loading and reduced sensitivity. When used as a transmitter, RF current pulses through a z-axis conductor of the localized coil induce magnetic fields in the x-y plane. Magnetic resonance signal components not in the x-y planes, i.e. z-axis components, are attributed solely to noise. Accordingly, it is desirable to suppress the reception of the z-axis RF field components.

The localized coil D includes a first or inner conductor 30 which defines a current path parallel to the z-axis and a second or outer conductor 32 which also extends parallel to the z-axis but is further displaced from the subject than the inner conductor. An electrical interconnecting means or conductor 34 interconnects first ends of the inner and outer electrical conductors. The interconnecting means is disposed parallel to the x-y plane to inhibit the induction of RF currents therein. A capacitive coupling means 36 couples second ends of the inner and outer conductors with a flexible cable 38. The coupling means also capacitively connects the second ends with the capacitors selected to set the resonance frequency of the localized coil.

The flexible cable 38 connects the localized coil with the remotely located processing circuitry E. More specifically, the cable conveys the received radio frequency signals from the surface coil to a radio frequency receiver 40. An imager 42 reconstructs the image representation from the received magnetic resonance signals and the magnetic field control and timing information from the central processer 22. The image representation may be converted to a man-readable display by a video monitor or other display means 44.

Figure 2:
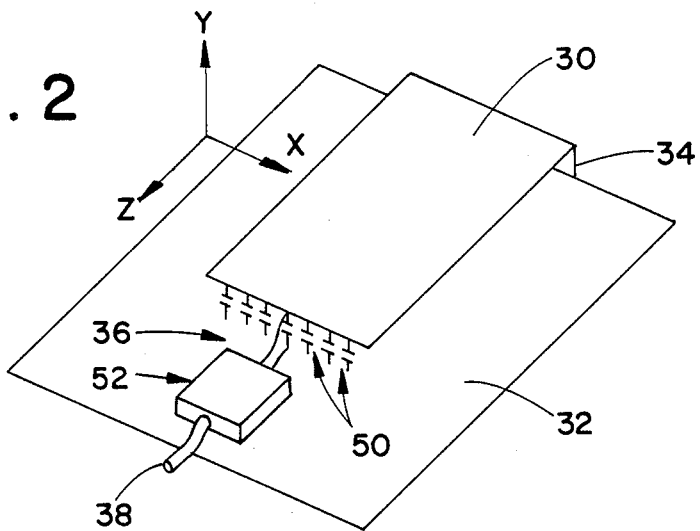
FIG. 2 is a perspective view illustrating a localized coil construction in accordance with the present invention.

With reference to FIG. 2, in a preferred embodiment, the inner conductor 30 is a flat plate of conductive material, e.g. a rectangular copper plate or sheet. The second conductor 32 is a larger plate, preferably also a rectangular copper sheet. The copper sheets may be supported on a dielectric reinforcing means. The electrical connecting means 34 is a conductive plate or sheet which connects one end of the conductors. The connecting conductive sheet is disposed substantially perpendicular to the inner and outer conductors and to the surface of the patient. When the first and second conductors are aligned with the z-axis, the connecting plate is disposed parallel to the x-y plane. In this orientation, radio frequency magnetic fields generated in the x-y plane will induce radio frequency currents flowing along the z-axis. Because high frequency coils tend to be dominated by subject generated noise, the coil sensitivity to areas outside of the region of interest is reduced. To this end, the inner conductor in closer proximity to the subject is reduced in size relative to the outer conductor of the surface coil. Making the outer plate larger than the inner increases the sensitivity of the localized coil D to signals originating deeper within the subject as well as reducing the sensitivity to magnetic resonance signals induced near the surface.

The coupling means 36 includes a series of evenly spaced capacitors 50 that are evenly distributed along the second end of the z-axis current path defined by the conductors. The total value of the capacitors is chosen so that the response occurs at a preselected frequency of operation. A matching and tuning circuit 52 matches the coil to the flexible transmission line 38, e.g. a 50 ohm coaxial conductor. The matching and tuning circuit also adjusts or tunes the capacitive coupling to tune the localized coil to the subject.

Figure 3:
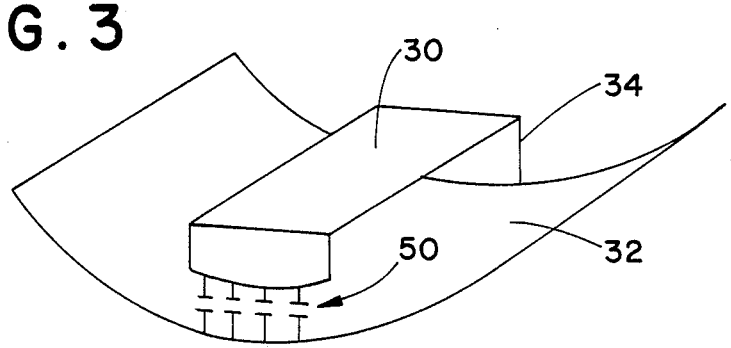
FIG. 3 is an alternate embodiment of the localized coil.

With reference to FIG. 3, the inner and outer conductors are again conductive sheets that define current paths in the z direction. The conductive connecting means 34 is again a conductive sheet extending parallel to the x-y plane. The inner conductive plate is relatively flat and the outer conductive plate 32 is curved. The curvature parallels a curved body portion such as a wrist, knee, or neck to be imaged. Alternately, the outer plates may be parabolic to focus at a selected point or plane within the subject. Capacitors 50 again interconnect the second ends of the plates.

Figure 4:
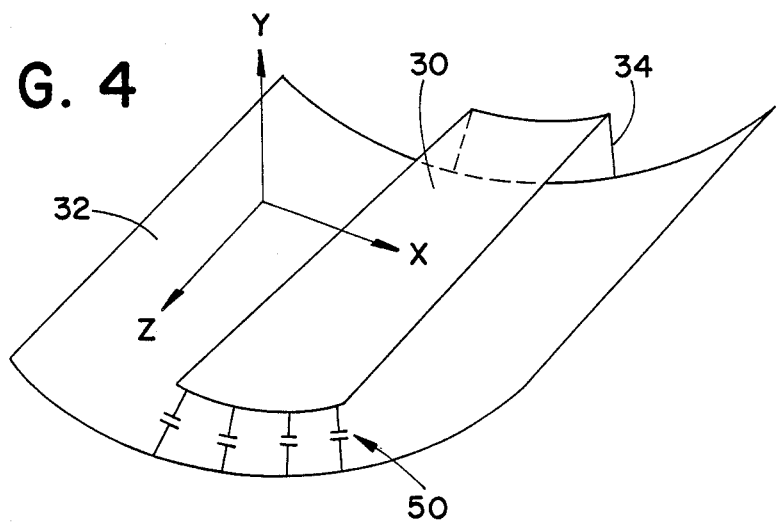
FIG. 4 is another alternate embodiment of the localized coil.

The embodiment of FIG. 4 is similar to the embodiment of FIG. 3 except that both the inner and outer plates are arcuate. Preferably, the inner and outer plates are defined by concentric arc segments. The embodiment of FIG. 4 is particularly advantageous for curved or cylindrical areas of the body.

Figure 5:
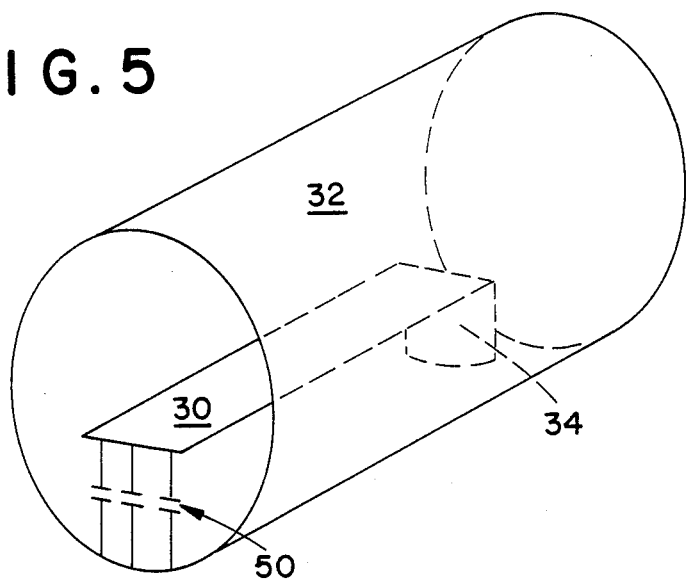
FIG. 5 is yet another alternate embodiment of the localized coil.

In the alternate embodiment of FIG. 5, the inner conductor 30 is again a flat plate extending along the z-axis. The outer conductor 32 is a tube of conductive material which surrounds the patient. Preferably, the second conductor is a bore liner, such as copper foil on a plastic cylinder, which conventionally lines the bore of a magnetic resonance imager. The conductive connecting portion 34 is again a sheet extending perpendicular to the z-axis and the bore liner.

Figure 6:
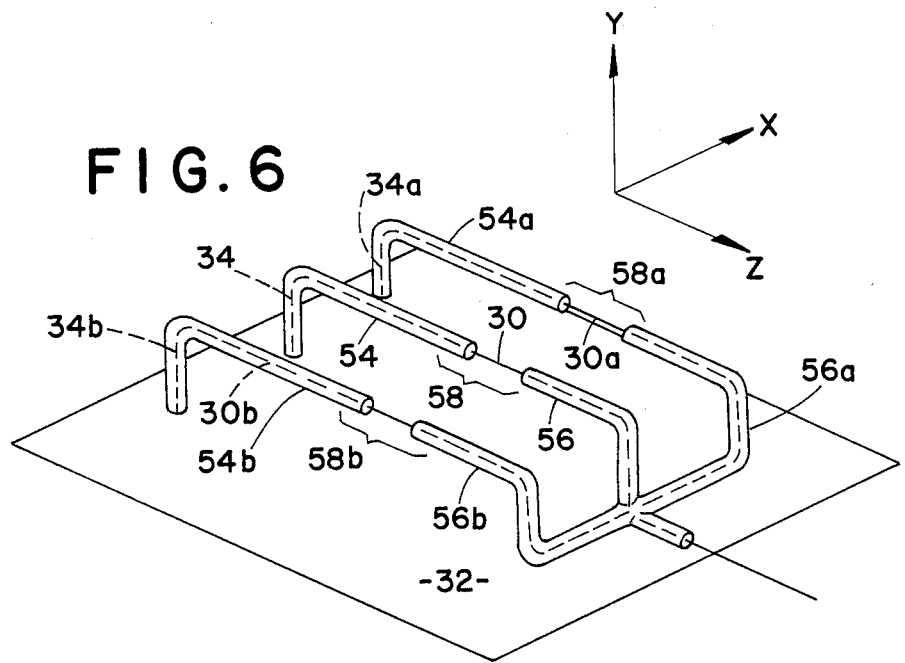
FIG. 6 is still another alternate embodiment of the localized coil.

In the embodiment of FIG. 6, a plurality of inner conductors 30, 30a and 30b are provided. The conductive connecting means includes a plurality of wire segments 34, 34a, 34b, which interconnect the conductors with the outer conductor plate 32. The inner conductors and the connecting conductors are surrounded by first tubular conductive Faraday shield portions 54, 54a, 54b. The other ends of the outer conductors are surrounded by second Faraday shield portions 56, 56a, 56b. The first and second Faraday shield portions define gaps 58, 58a, 58b therebetween through which the outer conductors are exposed. All Faraday shield portions are electrically connected with the outer conductive plate 32. The outer conductors and surrounding shield portions may be sections of coaxial cable which may merge integrally or with the matching circuit 36 to the cable 38. The outer coaxial cable conductor may be removed while the dielectric material is retained to define the gaps. Preferably, the gaps are aligned with an x-y image plane. Alternately, a single Faraday shield may surround a plurality of inner conductors or a wide conductive plate. The one or both of the conductor may also be a combination of plates, parallel wires, flat or curved, conductive strips, perforated plates, conductive tubes, or the like.

The invention has been described with reference to the preferred embodiments. Obviously modifications and alterations will occur to others upon reading and understanding the preceeding specification. It is intended that the invention be construed as including all such alterations and modifications insofar as they come within the scope of the appended claims or the equivalents thereof.

Having thus described the preferred embodiments, the invention is now claimed to be:

1. A magnetic resonance apparatus comprising:
   a main magnetic field generating means for generating a main magnetic field along a main field axis through an examination region;
   a magnetic resonance excitation means for exciting magnetic resonance of nuclei of a subject in the examination region;
   a localized coil assembly for receiving radio frequency signals from the resonating nuclei, the coil assembly including:
      an inner conductor defining a first current path along the main field axis and closely adjacent a surface of the subject,
      an outer conductor defining a current path along the main magnetic field axis, generally parallel to a surface of the subject and displaced further from the subject than the inner conductor,
      a connecting means for electrically connecting adjacent first ends of the inner and outer conductors; and,
      a coupling means connected adjacent second ends of the inner and outer conductors for interconnecting the conductors with a cable extending to a receiver.

2. The apparatus as set forth in claim 1 wherein the outer conductor includes an outer plate extending parallel to the main field axis from the first end to the second end.

3. The apparatus as set forth in claim 2 wherein the outer conductive plate is flat.

4. The apparatus as set forth in claim 2 wherein the outer conductive plate is arcuate.

5. The apparatus as set forth in claim 4 wherein the outer plate is substantially cylindrical surrounding both the inner conductor and the subject.

6. The apparatus as set forth in claim 2 wherein the inner conductor is an inner plate extending along the main field axis between its first and second ends.

7. The apparatus as set forth in claim 6 wherein the inner and outer plates are parallel to each other.

8. The apparatus as set forth in claim 6 wherein the inner plate is generally flat and the outer plate is arcuate.

9. The apparatus as set forth in claim 1 wherein the connecting means and a portion of the inner conductor are surrounded by a first Faraday shield, which electrical shield is interconnected with the outer plate.

10. The apparatus as set forth in claim 9 further including at least one additional conductor disposed parallel to the inner conductor and surrounded by a second Faraday shield along a portion of its length.

11. The apparatus as set forth in claim 10 wherein the first and second shields are connected with the second plate adjacent the first and second ends and each shield has a gap therein, the gaps being in alignment with each other.

12. A localized coil for receiving magnetic resonance signals from resonating nuclei of a subject disposed in a magnetic field, the localized coil comprising:
   an inner conductive plate having first and second ends disposed adjacent and parallel to a surface of the subject and in alignment with the magnetic field;
   an outer conductive plate disposed adjacent and generally parallel to the inner conductive plate but further from the subject, the outer conductive plate being generally parallel to a surface of the subject and defining a conductive path extending in alignment with the magnetic field from a first end to a second end thereof;
   an electrical connecting means interconnecting first ends of the inner conductive plate and the outer conductive plate; and,
   a coupling means connected with second ends of the inner and outer conductive plates for connecting the coil with an electrical cable.

13. The coil as set forth in claim 12 wherein at least one of the inner and outer conductive plates is arcuate.

14. The coil as set forth in claim 12 wherein the outer conductive plate is larger at least along an axis transverse to the magnetic field than the inner conductive plate along a common transverse axis.

15. The coil as set forth in claim 12 wherein the coupling means includes a capacitive coupling between the inner and outer plates.

16. A localized coil for receiving magnetic resonance signals from resonating nuclei of a subject disposed in a magnetic field, the localized coil comprising:
   an inner electrical conductor having first and second ends disposed adjacent and parallel to a surface of the subject and in alignment with the magnetic field;
   an outer conductive plate disposed adjacent the inner conductor but further from the subject, the outer conductive plate being generally parallel to a surface of the subject and defining a conductive path extending in alignment with the magnetic field from a first end to a second end thereof;
   an electrical connecting means interconnecting first ends of the inner conductor and the outer conductive plate;
   a first shielding means extending from the outer conductive plate around the connecting means and partially along and around the inner conductor; and
   a coupling means connected with the second ends of the inner conductor and the outer conductive plate for connecting the coil with an electrical cable.

17. The coil as set forth in claim 16 further including an additional shielding means operatively connected with the outer plate adjacent the second end and extending along and around the inner conductor, the first and second shielding means defining a gap therebetween such that a small section of the inner conductor is exposed.

18. The coil as set forth in claim 17 further including a plurality of inner conductors and shielding means disposed in parallel along the magnetic field.

19. A magnetic resonance imaging apparatus comprising:
   a main magnetic field generating means for generating a main magnetic field along a main field axis through an image region;
   a magnetic resonance excitation means for exciting magnetic resonance of nuclei of a subject in the image region;
   a gradient field means for causing gradient magnetic fields across the main magnetic field;
   a receiving coil assembly for receiving radio frequency signals from the resonating nuclei, the coil assembly including:
      a first conductor disposed parallel to the main field axis and closely adjacent a surface of the subject,
      a second conductor having at least one radio frequency signal transmission aperture therethrough and extending along the main magnetic field axis and generally parallel to the surface of the subject, and displaced further from the subject than the first conductor,
      a connecting means for electrically connecting adjacent ends of the first and second conductors;
   a coupling means connected adjacent opposite ends of the first and second conductors from the connecting means for interconnecting the conductors with a cable;
   an image reconstruction means operatively connected with the cable for reconstructing a magnetic resonance image representation from the received signals.

20. A magnetic resonance method comprising:
disposing a subject in a magnetic resonance receiving coil arrangement which includes an inner conductor extending along a first axis, an outer conductor disposed parallel to the inner conductor and the first axis but displaced further from the subject than the inner conductor, a conductive connecting member for connecting first ends of the inner and outer conductors, and a capacitive coupling which is selected to provide a preselected receiving coil resonance frequency coupling the inner and outer conductors adjacent second ends thereof;
generating a main magnetic field through the subject along the first axis parallel to the inner and outer conductors;
exciting magnetic resonance of nuclei of the subject with radio frequency signals emanating further from the subject than the outer conductor such that magnetic resonance signals are generated by the nuclei within the subject;
receiving the magnetic resonance signals with the inner and outer conductors such that corresponding currents are induced therein;
processing the induced currents into a man-readable representation indicative of at least one characteristic of the resonating nuclei.

* * * * *